(12) United States Patent
Liou

(10) Patent No.: US 9,324,570 B1
(45) Date of Patent: Apr. 26, 2016

(54) METHOD OF MANUFACTURING SEMICONDUCTOR DEVICE

(71) Applicant: UNITED MICROELECTRONICS CORP., Hsin-Chu (TW)

(72) Inventor: En-Chiuan Liou, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/656,721

(22) Filed: Mar. 13, 2015

(51) Int. Cl.
| H01L 21/302 | (2006.01) |
| H01L 21/311 | (2006.01) |
| H01L 21/308 | (2006.01) |
| H01L 29/66  | (2006.01) |
| H01L 21/033 | (2006.01) |

(52) U.S. Cl.
CPC ........ *H01L 21/3086* (2013.01); *H01L 21/0337* (2013.01); *H01L 21/0338* (2013.01); *H01L 21/308* (2013.01); *H01L 21/31111* (2013.01); *H01L 29/6656* (2013.01); *H01L 29/66795* (2013.01)

(58) Field of Classification Search
CPC ............ H01L 21/0337; H01L 21/0338; H01L 21/3086; H01L 21/3088; H01L 21/3111; H01L 21/31144; H01L 29/66795; H01L 27/0886
See application file for complete search history.

(56) References Cited

U.S. PATENT DOCUMENTS

| 7,115,525 | B2 | 10/2006 | Abatchev |
| 7,202,148 | B2 | 4/2007  | Chen |
| 7,856,613 | B1 | 12/2010 | Weling |
| 8,142,986 | B2 | 3/2012  | Sim |
| 8,247,291 | B2 | 8/2012  | Min |
| 8,293,656 | B2 | 10/2012 | Kim |
| 8,846,490 | B1 | 9/2014  | Shieh |
| 2013/0001750 | A1* | 1/2013 | Arnold ............... H01L 21/3086 257/618 |
| 2013/0174103 | A1 | 7/2013 | Shieh |

* cited by examiner

*Primary Examiner* — Thanhha Pham
(74) *Attorney, Agent, or Firm* — Winston Hsu; Scott Margo

(57) ABSTRACT

The present invention provides a method of manufacturing a semiconductor device including using a first photomask to form a sacrificial block on a hard mask layer in a first region, a first dummy pattern on the sacrificial block, a first spacer on sidewalls of the sacrificial block and a second spacer in a second region; using a second photomask to form a feature mask on the first dummy pattern and a fin cutting mask on the second spacer; and performing a fin cutting process to remove a portion of the first dummy pattern, a portion of the sacrificial block underlying the portion of the first dummy pattern and the first spacer to form a feature spacer and to remove a portion of the second spacer without being covered with the fin cutting mask to form a fin spacer.

11 Claims, 13 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly, to a method of manufacturing a semiconductor device having a fin structure including using only one photomask to form a feature mask larger than the fin structure and a fin cutting mask for defining the fin structure.

2. Description of the Prior Art

Conventional planar metal-oxide-semiconductor (MOS) transistor has difficulty when scaling down to 65 nm and below. Therefore the non-planar transistor technology such as Fin Field effect transistor (hereinafter abbreviated as FinFET) technology that allows smaller size and higher performance is developed to replace the planar MOS transistor.

Since the FinFET includes a fin structure, the overlapping area between a gate electrode and the fin structure can be increased, and the channel width is accordingly increased. The fin structure is conventionally formed by: First a sacrificial mandrel is formed by performing a photolithographic process with a first photomask. A spacer is formed on sidewalls of the sacrificial mandrel to surround the sacrificial mandrel by performing a deposition process and an etching back process, and the sacrificial mandrel is removed. Next, the spacer is cut by performing a fin cutting process with a second photomask to form two fin structures.

Besides forming the FinFET, the conventional method of manufacturing a semiconductor device including the FinFET and other devices larger than the FinFET requires extra processes and photomasks to form the other devices, which limits the manufacturing cost. Therefore, a method of manufacturing a semiconductor device with reduction to the manufacturing cost is always in need.

SUMMARY OF THE INVENTION

According to an aspect of the present invention, a method of manufacturing a semiconductor device is provided. According to provided method, a semiconductor substrate and a hard mask layer are provided, wherein the hard mask layer is disposed on the semiconductor layer, and the semiconductor substrate has a first region and a second region defined thereon. Next, a first photomask is used to form a sacrificial block on the hard mask layer in the first region, a first dummy pattern on the sacrificial block, a first spacer on sidewalls of the sacrificial block and a second spacer on the hard mask layer in the second region. Thereafter, a second photomask is used to form a feature mask on a portion of the first dummy pattern and a fin cutting mask on a portion of the second spacer and the hard mask layer. Following that, a fin cutting process is performed to remove other portions of the first dummy pattern without being covered with the feature mask, a portion of the sacrificial block underlying the other portions of the first dummy pattern and the first spacer to form a feature spacer and to remove other portions of the second spacer without being covered with the fin cutting mask to form a fin spacer. Then, the fin spacer and the feature spacer are transferred to the hard mask layer to form a fin hard mask and a feature hard mask. Subsequently, the fin hard mask and the feature hard mask are transferred to the semiconductor layer to form a fin structure and a feature structure.

The method of manufacturing the semiconductor device in the present invention use the sidewall image transfer (SIT) process with only two photomasks to form not only the fin structures but also the feature structures. Since that, the method of the present invention doesn't require an extra photomask for further defining the feature structure, thereby reducing the manufacturing cost.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
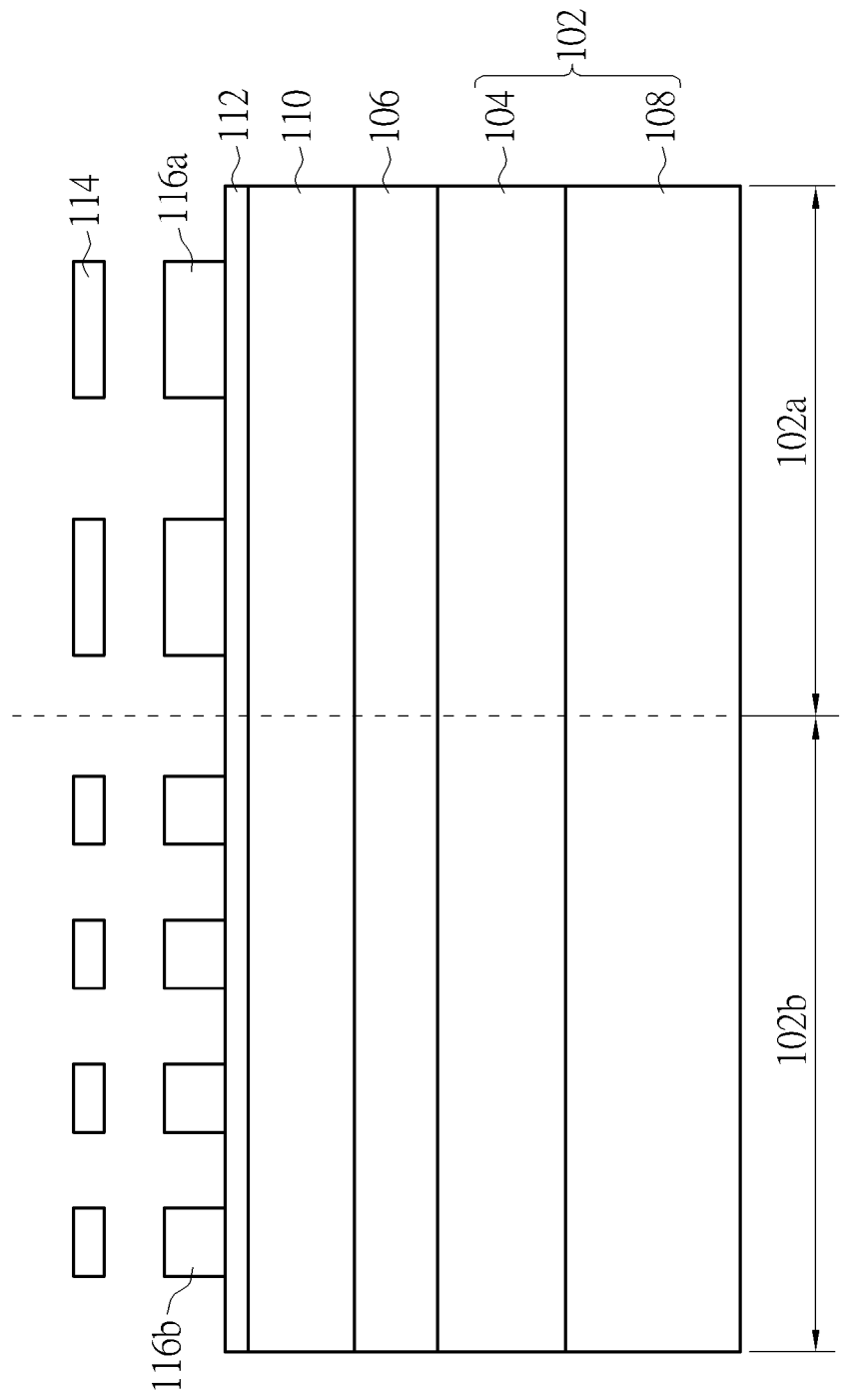
FIG. 1 through FIG. 10 are schematic diagrams illustrating a method of manufacturing a semiconductor device according to a first preferred embodiment of the present invention.
Figure 4:
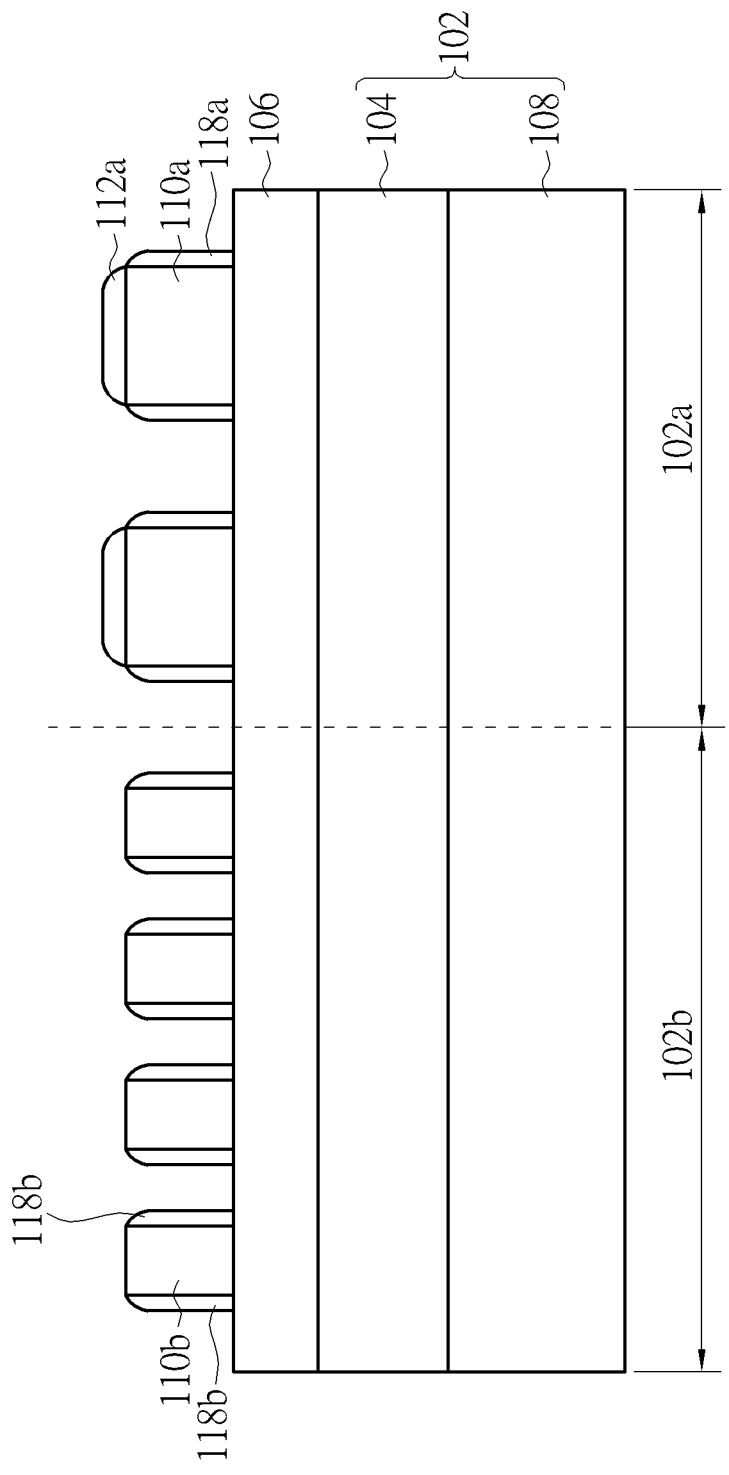
Figure 5:
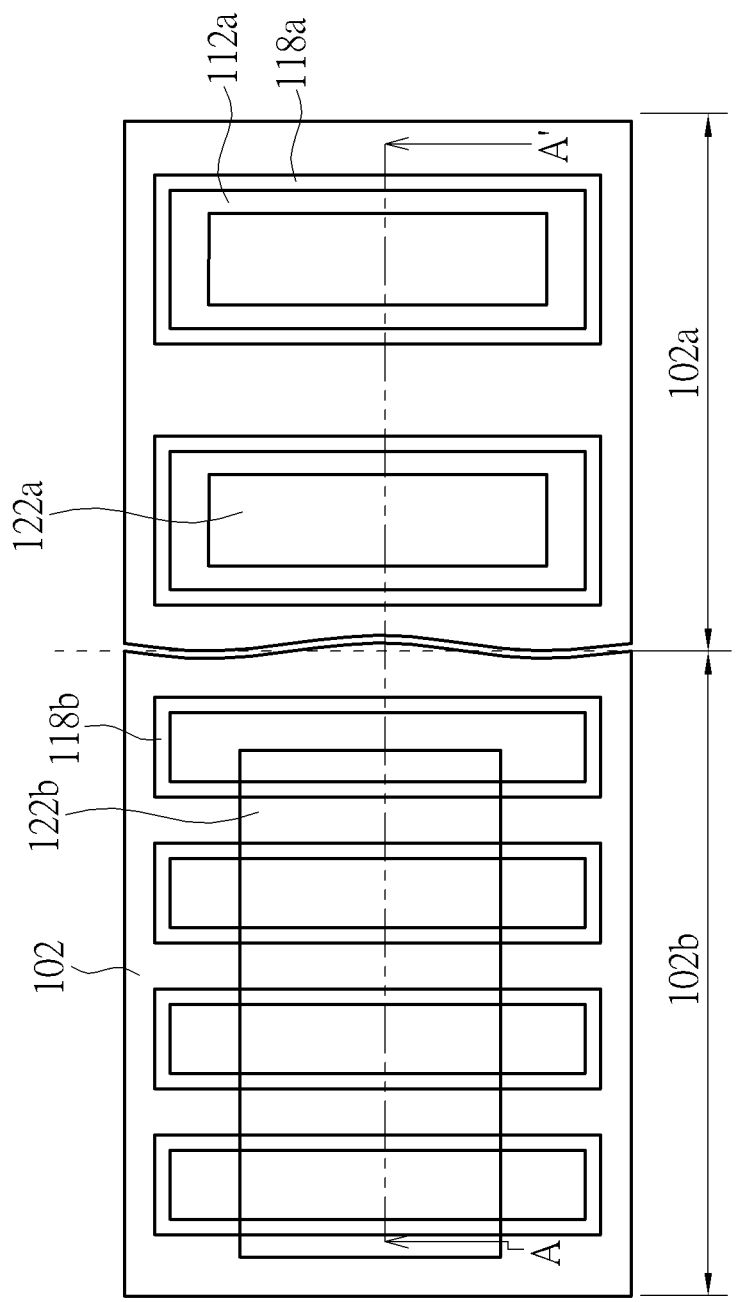
Figure 6:
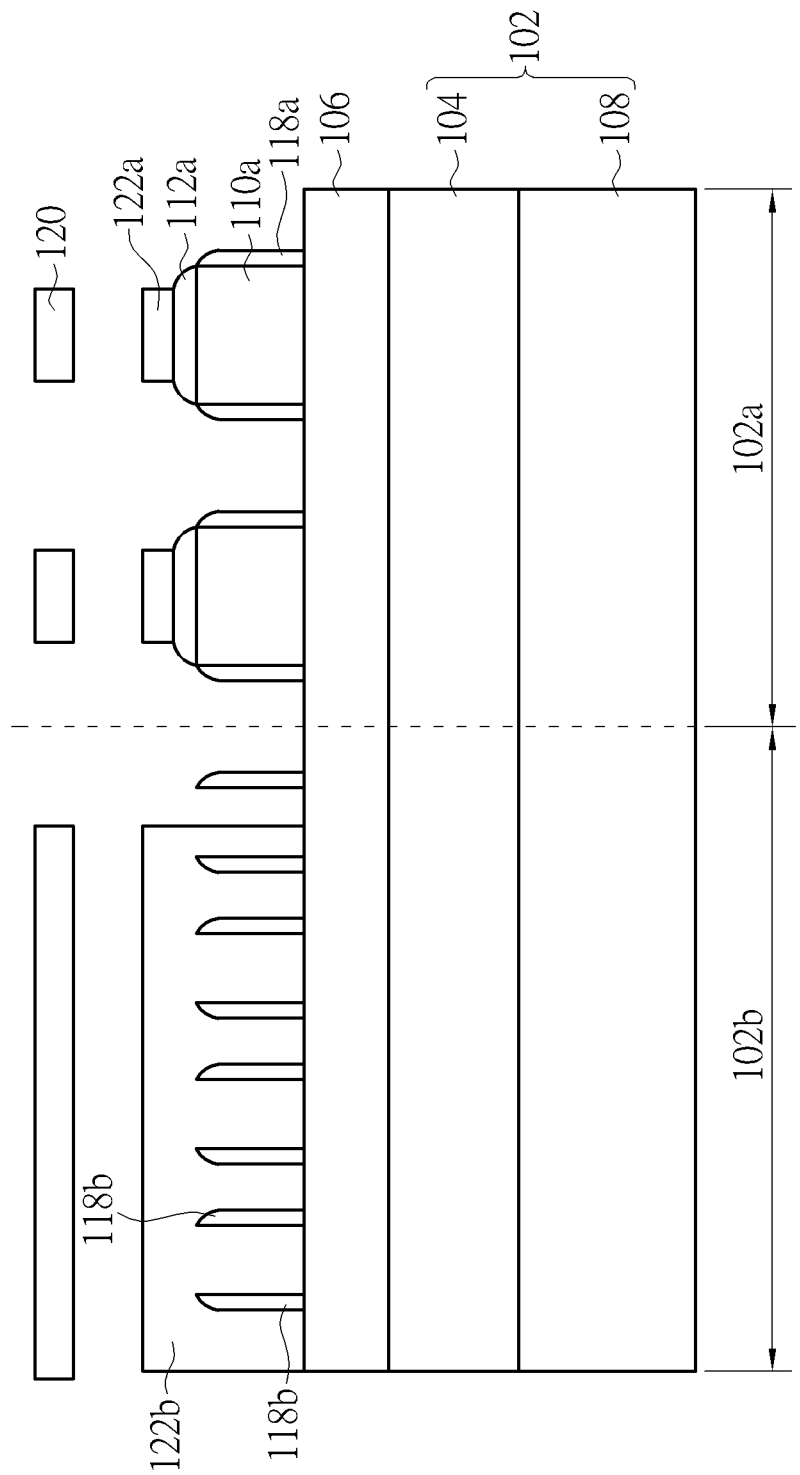
Figure 7:
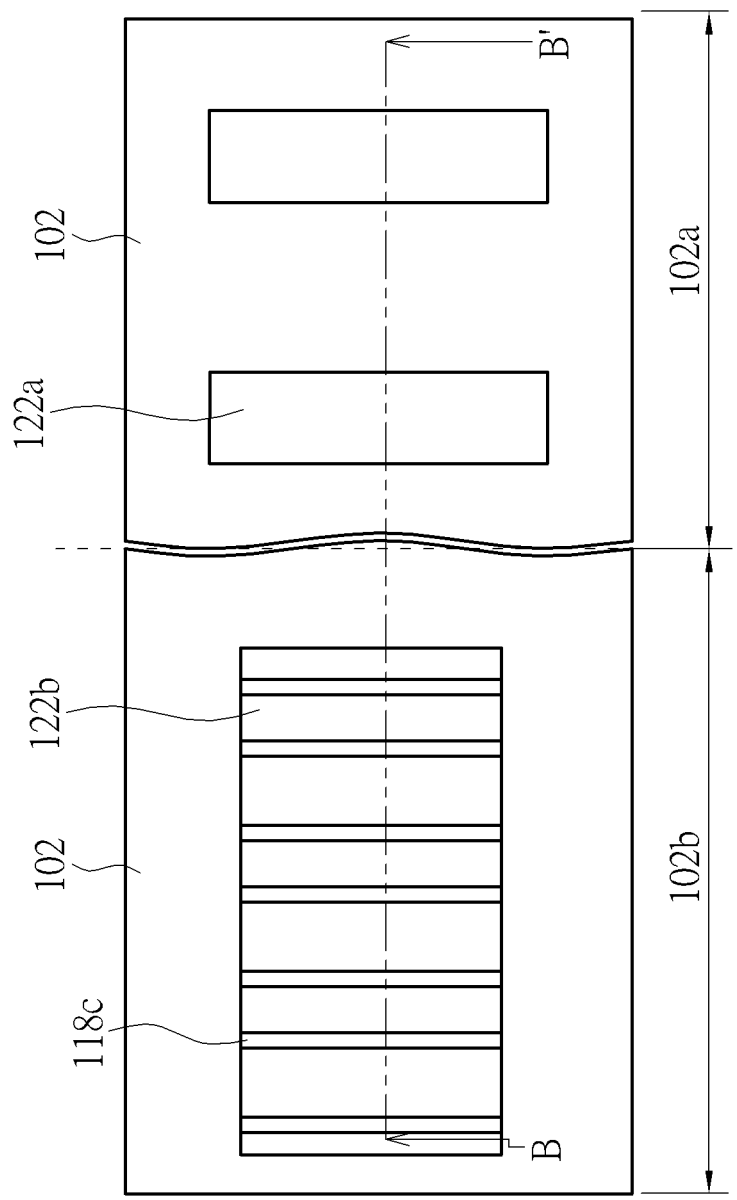
Figure 8:
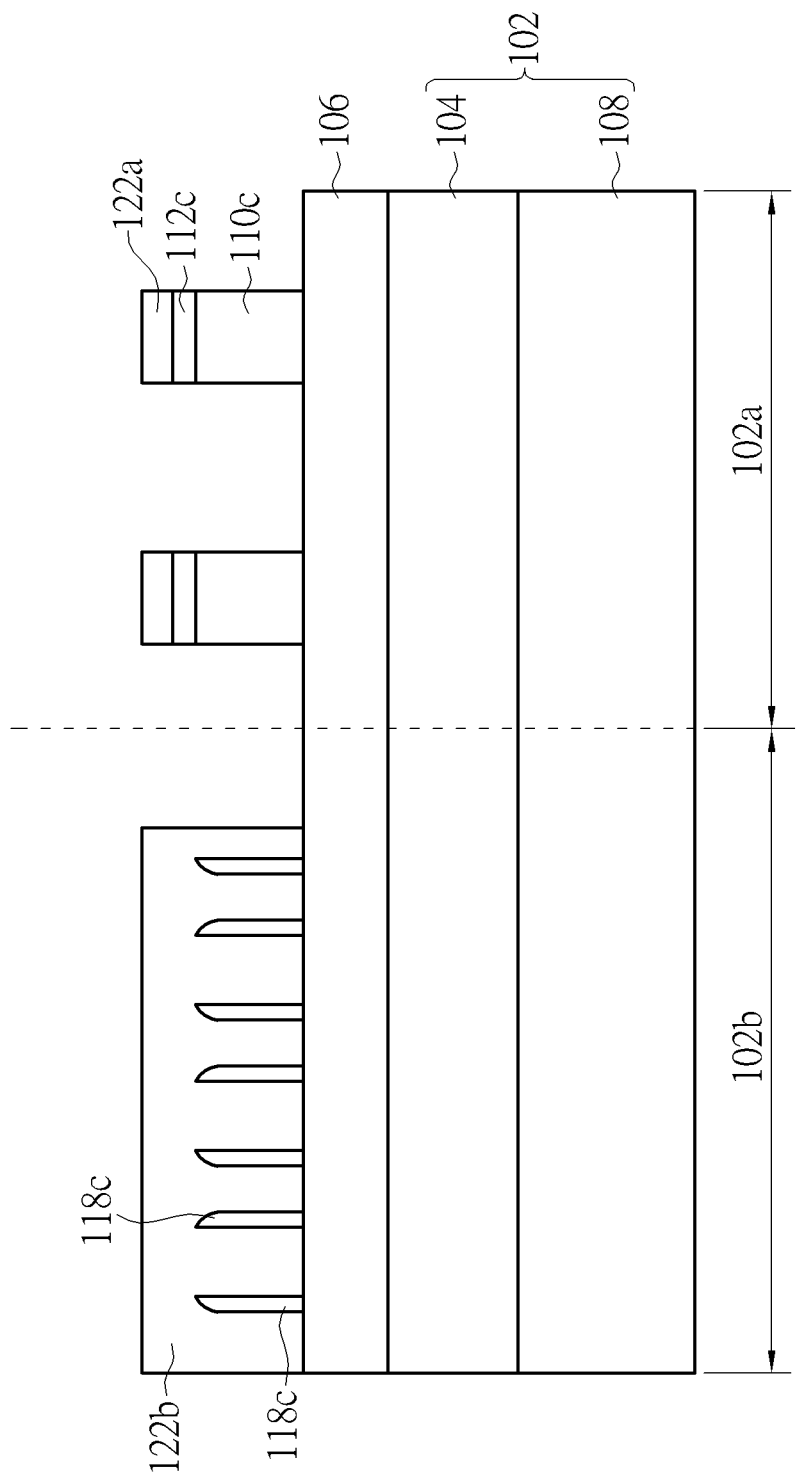

Refer to FIG. 1 through FIG. 10, which are schematic diagrams illustrating a method of manufacturing a semiconductor device according to a first preferred embodiment of the present invention. FIG. 6 is a cross-sectional view taken along a line A-A' of FIG. 5. FIG. 8 is a cross-sectional view taken along a line B-B' of FIG. 7. As shown in FIG. 1, a substrate 102 and a hard mask layer 106 are provided first. In this embodiment, the hard mask layer 106 is disposed on the semiconductor substrate 102. The semiconductor substrate 102 may include a semiconductor layer 104 and a support substrate 108. For example, the support substrate may be, but not limited to, a bulk silicon, a semiconductor wafer or a silicon-on-insulator (SOI) substrate, and a plurality of conductive structure may be arranged on the support substrate 108. The semiconductor layer 104, which is partially used to form a conductive fin structure, may be composed of a silicon containing material. Silicon containing materials include, but are not limited to, Si, single crystal Si, polycrystalline Si, SiGe, single crystal silicon germanium, polycrystalline silicon germanium, silicon doped with carbon, amorphous Si and combinations and multi-layered materials thereof. The hard mask layer 106 may include a material that has high etching selectivity with respect to the silicon, such as silicon nitride or silicon oxide.

Furthermore, a first region 102a and a second region 102b are defined on the substrate 102. The second region 102b may be, but not limited to, a core region for arranging FinFETs or a cell array area for arranging a plurality of unit memory devices, and the first region 102a may be, but not limited to, an input/output (I/O) region, a region for disposing a device, such as an ESD protection device and a power device, or a peripheral region for disposing a number of peripheral circuits.

A sacrificial layer 110 is formed on the hard mask layer 106. A dummy layer 112 is formed on the sacrificial layer 110. A first mask layer is formed on the dummy layer 112. Then, a first photomask 114 is used to pattern the first mask layer to form a plurality of transitional masks 116a in the first region 102a and a plurality of mandrel masks 116b in the second region 102b. The transitional masks 116a are used to define regions, and each of the regions is larger than or equal to a feature structure that requires to be formed in the first region 102a, so that each transitional mask 116a is larger than or equal to the feature structure. The mandrel masks 116b are used to define mandrel structures in the second region 102b. Thus, each mandrel mask 116b may have a relative smaller line width than each transitional mask 116a. Preferably, the line width of the sacrificial mandrels 110b may reach the resolution limitation of the lithography apparatus, so that the required fin structure may has line width less than each mandrel mask 116b. The first mask layer may have high etching selectivity with respect to the dummy layer, and the material of the first mask layer may include photoresist, oxide or nitride. In this embodiment, the number of the transitional masks 116a is depended on the number of the feature structures, and may be at least one. The number of the mandrel masks is depended on the number of the mandrel structures, and may be at least one.

In this embodiment, the first photomask 114 are disposed corresponding to the transitional masks 116a and the mandrel masks 116b, but the present invention is not limited thereto. In another embodiment, openings of the first photomask may be disposed corresponding to the transitional masks and the mandrel masks according to the material of the first mask layer.

In another embodiment, the mandrel masks may be formed by a double patterning method. For example, the first mask layer is composed of photoresist. The first mask layer may be treated by two exposure processes with two respective photomasks and then treated by a development process to form the mandrel masks. Or, the first mask layer may be treated by one exposure process with one photomask and then treated by a development process to form a part of the mandrel masks, such as odd mandrel masks. Next, another mask layer is formed on the odd mandrel masks, and then is treated by another exposure process with another photomask and then treated by another development process to form the other part of the mandrel masks, such as even mandrel masks. Each odd mandrel mask and each even mandrel masks are alternatively arranged in a direction.

Figure 2:
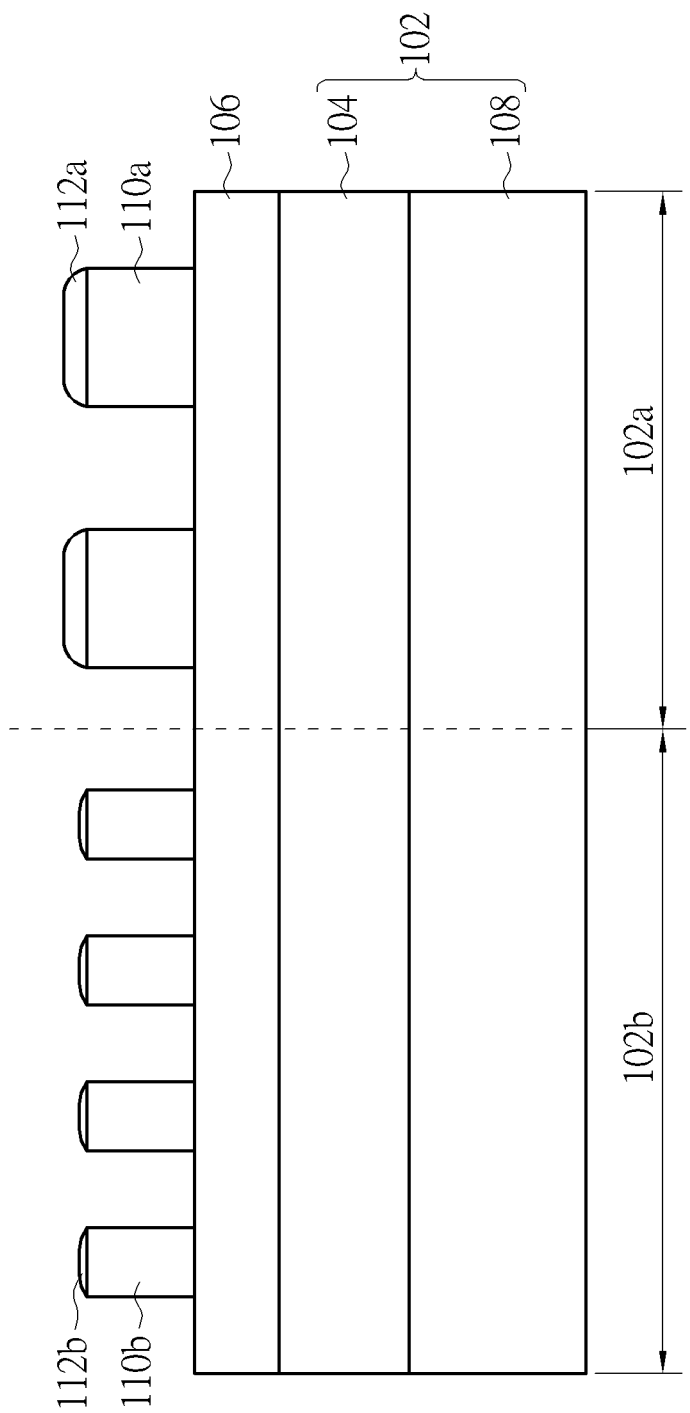

As shown in FIG. 2, after forming the transitional masks 116a and the mandrel masks 116b, through using the transitional masks 116a and the mandrel masks 116b as an etching mask, a first etching process, such as an anisotropic etching process, may be performed to pattern the dummy layer 112 to form a plurality of first dummy patterns 112a underlying the transitional masks 116a and a plurality of second dummy patterns 112b underlying the mandrel masks 116b. Each first dummy pattern 112a has substantially the same line width as each transitional mask 116a, and each second dummy pattern 112b has substantially the same line width as each mandrel mask 116b. After removing the transitional masks 116a and the mandrel masks 116b, a second etching process is performed to transfer the first dummy patterns 112a and the second dummy patterns 112b to the sacrificial layer 110 to form a plurality of sacrificial blocks 110a underlying the first dummy patterns 112a and a plurality of sacrificial mandrels 110b underlying the second dummy pattern 112b respectively. It should be noted that since the line width of the second dummy pattern 112b is smaller than the line width of the first dummy patterns 112a, the etching rate of each second dummy pattern 112b is much greater than that of each first dummy pattern 112a. Accordingly, a greater portion of each second dummy pattern 112b is removed as compared to each first dummy pattern 112a in the etching process for patterning the sacrificial layer 110, and the thickness of each second dummy pattern 112b may be smaller than the thickness of each first dummy pattern 112a when the sacrificial blocks 110a and the sacrificial mandrels 110b are formed.

Figure 3:
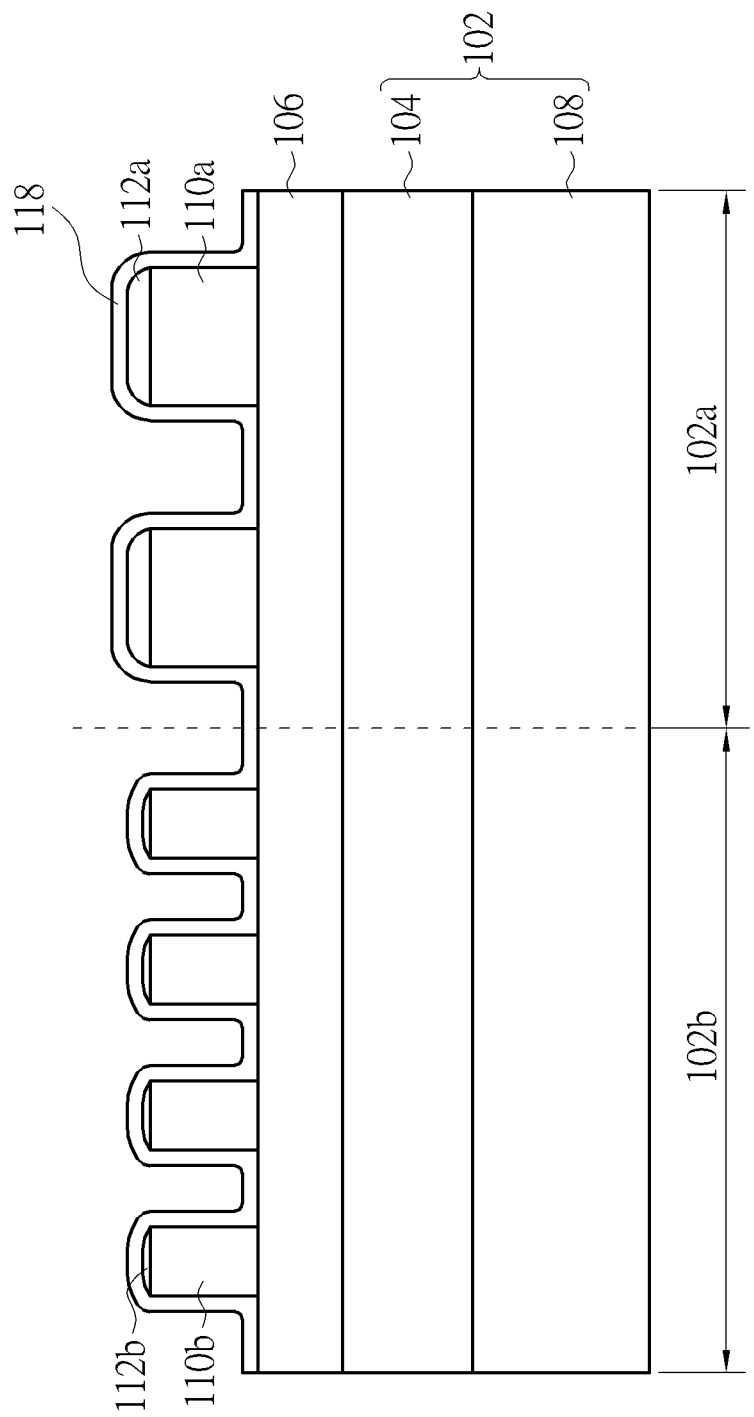

As shown in FIG. 3, a spacer layer 118 may be conformally formed on the hard mask layer 106, the first dummy patterns 112a and the second dummy patterns 112b and on sidewalls of the sacrificial blocks 110a and the sidewalls of the sacrificial mandrels 110b. The spacer layer 118 may include a material, such as an oxide or a nitride.

As shown in FIG. 4, a third etching process, such as an anisotropic etching process, is performed to partially remove the spacer layer 118 from the substrate 102, thereby forming a plurality of first spacers 118a respectively on the sidewalls of the sacrificial blocks 110a in the first region 102a and a plurality of second spacers 118b respectively on the sidewalls of the sacrificial mandrels 110b in the second region 102b and simultaneously removing the second dummy patterns 112b while maintaining the first dummy patterns 112a.

It should be noted that through the third etching process, the line width of each formed second spacer 118b can be smaller than the line width of each sacrificial mandrel 110b. Since the line width of the sacrificial mandrels 110b may reach the resolution limitation of the lithography apparatus, through the above-mentioned steps, each second spacer 118b can have smaller line width than the minimum resolution of the lithography apparatus.

In the third etching process, since the line width of each second dummy pattern 112b is smaller than the line width of each first dummy pattern 112a, each second dummy pattern 112b on each sacrificial mandrel 110b may be fully removed, and a top surface of each sacrificial mandrel 110b may be exposed. In contrast, each first dummy pattern 112a may be partially removed and remain on each sacrificial block 110a, so that each first dummy pattern 112a still covers a top surface of each sacrificial block 110a. Since the second dummy patterns 112b are fully removed in the third etching process, the remained first dummy patterns 112a can be used to resist a following fourth etching process for removing the sacrificial mandrels 110b, thereby saving a photomask to define a mask for removing the second dummy patterns 112b while maintaining the first dummy patterns 112a. In another embodiment, the spacer layer and each second dummy pattern may be etching in different times. That is, each second dummy pattern may be removed after the first spacers and the second spacers are formed.

Since each first spacer 118a and each second spacer 118b are formed around each sacrificial block 110a and each sacrificial mandrel 110b respectively, each first spacer 118a and each second spacer 118b would be substantially rectangular shaped if viewed from the top.

As shown in FIG. 5 and FIG. 6, a fourth etching process may be performed to selectively remove the sacrificial mandrels 110b. At the same time, the first spacers 118a, the second spacers 118b, the first dummy patterns 112a and the sacrificial blocks 110a remain on the substrate 102 in this embodiment. Specifically, since the sacrificial blocks 110a are covered with the first dummy patterns 112a, only the sacrificial mandrels 110b are removed. After that, a second mask layer is formed to cover the substrate 102, the first spacers 118a, the second spacers 118b and the first dummy patterns 112a. A second photomask 120 is used to pattern the second mask layer to form a plurality of feature masks 122a on the first dummy patterns 112a respectively and at least one fin cutting mask 122b on the second spacers 118b and the substrate 102. The fin cutting mask 122b partially overlaps the second spacers 118b, and exposes at least an unwanted portion of each second spacer 118b. The feature masks 122a are used to define the pattern of the feature structures, and a line width of each feature mask 122a is larger than a line width of each second spacer 118b. In this embodiment, the line width of each feature mask 122a may be two to five times larger than the line width of each second spacer 118b. In another embodiment, each feature mask may be used to form a trench corresponding to a scribe line for separating two dies. The line width of each feature mask may be one thousand times larger than the line width of each second spacer.

As shown in FIG. 7 and FIG. 8, through using the feature masks 122a and the fin cutting mask 122b as an etching mask, a fin cutting process is performed to remove a portion of each first dummy pattern 112a without being covered with each feature mask 122a, a portion of each sacrificial block 110a underlying the portion of each first dummy pattern 112a and the first spacers 118a to form a plurality of sacrificial features 110c and a plurality of dummy features 112c stacked sequentially and to remove a portion of the second spacers 118b without being covered with the fin cutting mask 122b to form a plurality of fin spacers 118c that are used to define the fin structures. The fin cutting process may be an anisotropic etching process, and the etching rates of the feature masks 122a and the fin cutting mask 122b are smaller than the etching rates of the first dummy patterns 112a, the sacrificial blocks 110a, the first spacer 118a and the second spacers 118b in the fin cutting process, so that the first dummy patterns 112a, the sacrificial blocks 110a, the first spacer 118a and the second spacers 118b exposed by the feature masks 122a and the fin cutting mask 122b can be removed. In this embodiment, while the unwanted portion of the second spacers 118b is removed, the rectangular shaped second spacers 118b are turned into individual columnar shaped fin spacers 118c. At the same time, the sacrificial blocks 110a and the first dummy patterns 112a underlying the feature masks 122a are remain on the substrate 102 and define the feature structure. Since the second photomask 120 can be used to form the feature masks 122a and the fin cutting mask 122b simultaneously, the feature structures and the fin structures can be defined together in the fin cutting process. It should be noted that the second dummy patterns 112b can be removed while etching the sacrificial layer 110 in this embodiment, so that the remained first dummy patterns 112a can be used to resist the fourth etching process for removing the sacrificial mandrels 110b. Accordingly, the first dummy patterns 112a can be patterned to be the dummy features 112c that define the feature structures 104a through the feature masks 122a.

Figure 9:
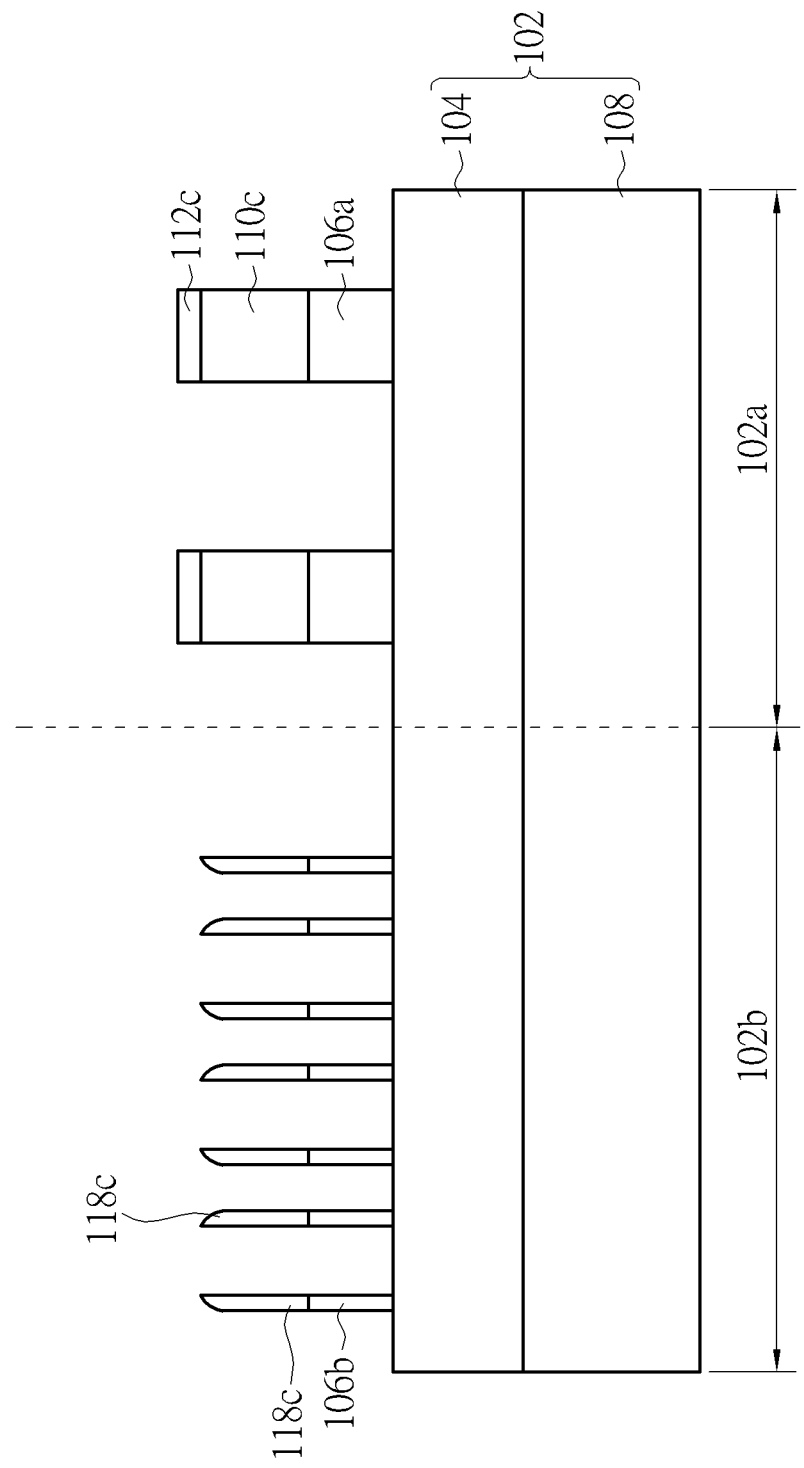

As shown in FIG. 9, the feature masks 122a and the fin cutting mask 122b are selectively removed. Next, through using the dummy features 112c and the fin spacers 118c as an etching mask, a fifth etching process is performed to pattern the hard mask layer, so that the pattern of the fin spacers 118c and the sacrificial features 110c can be transferred to the hard mask layer 106 to form a plurality of feature hard masks 106a and a plurality of fin hard masks 106b. In another embodiment, the dummy features 112c may be removed before performing the fifth etching process, and the fifth etching process using the sacrificial features 110c as an etching mask. In another embodiment, the feature masks and the fin cutting mask may be formed after transferring the pattern of the first spacers, the second spacers, the first dummy patterns and the sacrificial blocks to the hard mask layer. Accordingly, the feature masks and the fin cutting mask are formed on the patterned hard mask layer. Then, the fin cutting process may be performed to form the feature hard masks and the fin hard masks.

Figure 10:
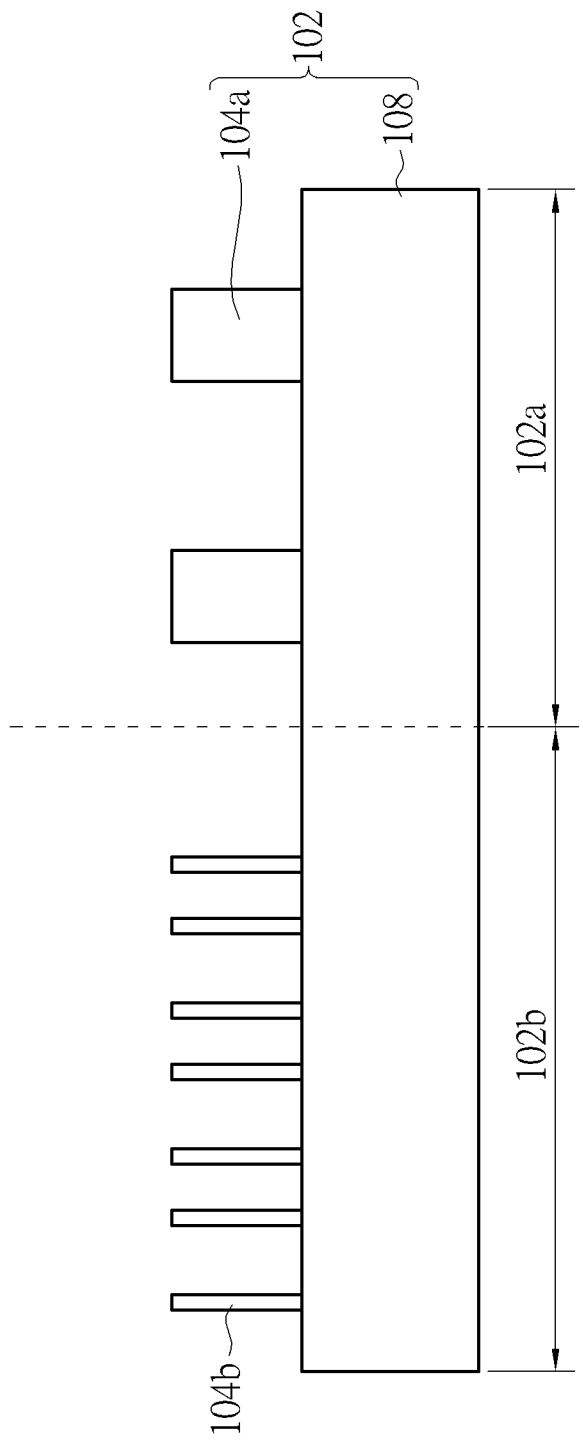

As shown in FIG. 10, through using the feature hard masks 106a and the fin hard masks 106b as an etching mask, a sixth etching process is performed to pattern the semiconductor layer 104, so that the pattern of the fin hard masks 106b and the feature hard masks 106a can be transferred to the semiconductor layer 104 to form a plurality of feature structures 104a in the first region 102a and a plurality of fin structures 104b in the second region 102b. Subsequently, the feature hard masks 106a, the sacrificial features 110c disposed on the feature hard masks 106a, the dummy features 112c disposed on the sacrificial features 110c, the fin hard masks 106b and the fin spacers 118c disposed on the fin hard masks 106b are removed, thereby forming the semiconductor device of this embodiment. In another embodiment, the sacrificial features 110c, the dummy features 112c and the fin spacers 118c may be removed before forming the feature structures 104a and the fin structures 104b. In another embodiment, after forming the feature structures 104a and the fin structures 104b, at least one gate structures may be further formed on the fin structures 104b in the second region 102b, and an ion implantation process may be further performed to form drain regions and source regions in the fin structures 106b, thereby forming the FinFETs. Also, the device in the first region 102a may be further formed in other process on the feature structures 104a.

It should be noted that the feature structures 104a and the fin structures 104b do not overlap each other, so that the second photomask 120 can be used to define them together. Thus, the method of manufacturing the semiconductor device in this embodiment only uses the first photomask 114 and the second photomask 120 to form not only the fin structures 104b but also the feature structures 104a. Since that, the method of this embodiment doesn't require an extra photomask for further defining the feature structures, thereby reducing the manufacturing cost.

The semiconductor device of the present invention is not limited to the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 11:
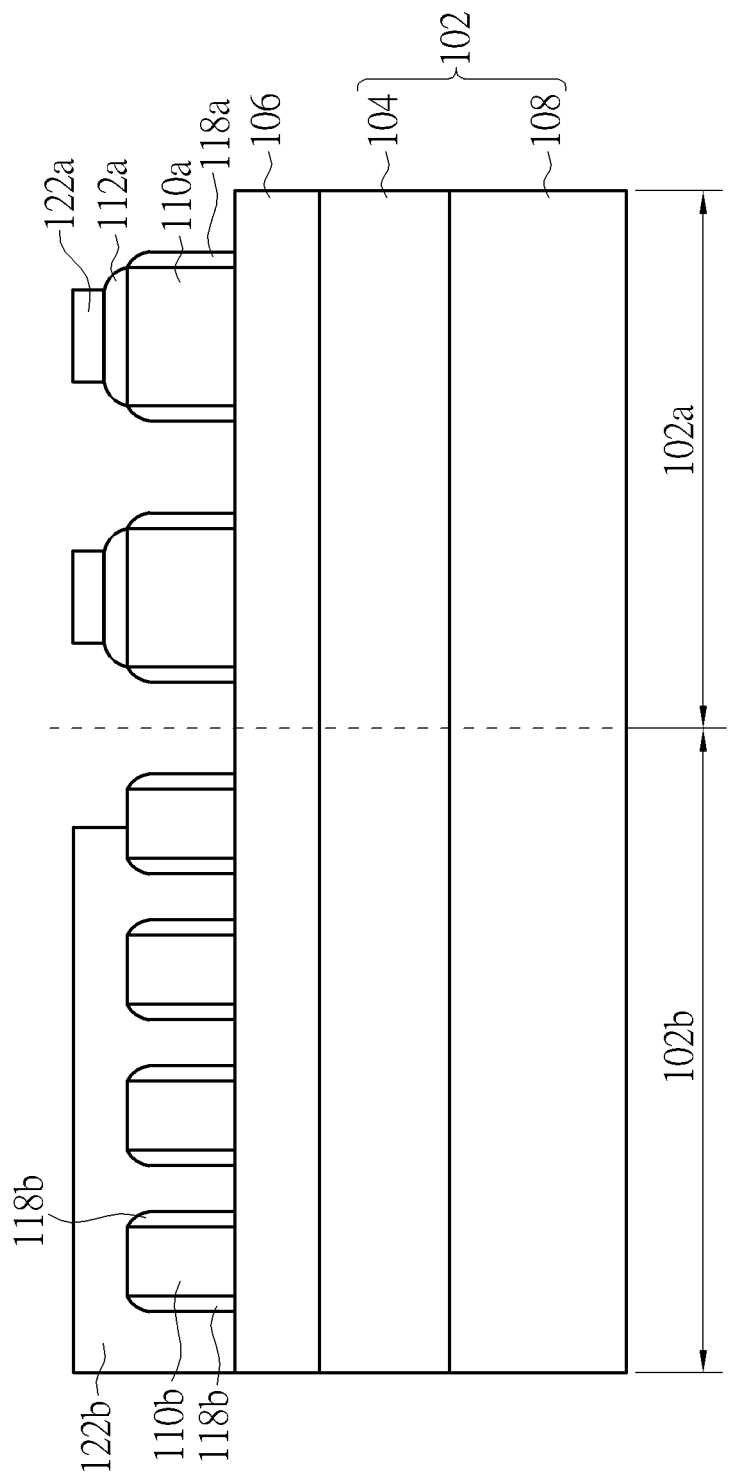
FIG. 11 and FIG. 12 are a schematic diagram illustrating a method of manufacturing a semiconductor device according to second preferred embodiment of the present invention.
Figure 12:
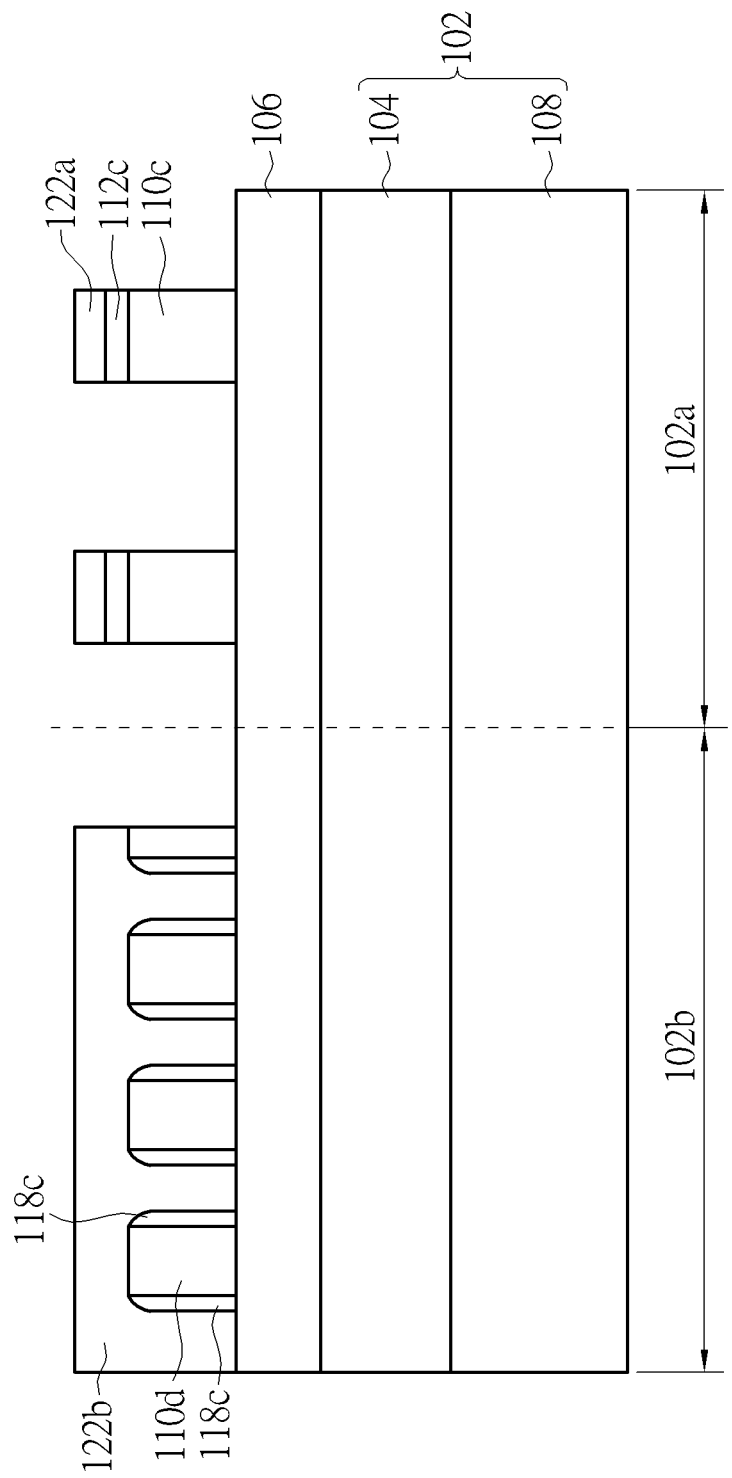

Refer to FIG. 11 and FIG. 12, which are a schematic diagram illustrating a method of manufacturing a semiconductor device according to second preferred embodiment of the present invention. In this embodiment, the step of forming the first spacers 118a and the second spacers 118b and removing the second dummy patterns 112b and the steps before it are the same as the first embodiment, and are not detailed redundantly. As shown in FIG. 11, thereafter, the sacrificial mandrels 110b is not removed before performing the fin cutting process in this embodiment, as compared with the first embodiment. Specifically, the step of forming the first spacers 118a and the second spacers 118b and removing the second dummy patterns 112b is followed by forming the feature masks 122a and the fin cutting mask 122b. The fin cutting mask 122b is disposed not only on the second spacers 118b but also on the sacrificial mandrels 110b. As shown in FIG. 12, after that, in addition to removing the portion of each first dummy pattern 112a, the portion of each sacrificial block 110a, the first spacers 118a and the portion of the second spacers 118b, the fin cutting process also removes a portion of the sacrificial mandrels 110b without being covered with the fin cutting mask 122b. Subsequently, the feature masks 122a and the fin cutting mask 122b are selectively removed. The remained sacrificial mandrels 110b is removed between removing the feature masks 122a and the fin cutting mask 122b and performing the fifth etching process that forms the fin hard masks 106b. Since the fifth etching process and the steps following the fifth etching process of this embodiment are the same as that of that of the first embodiment, they are not detailed redundantly.

Figure 13:
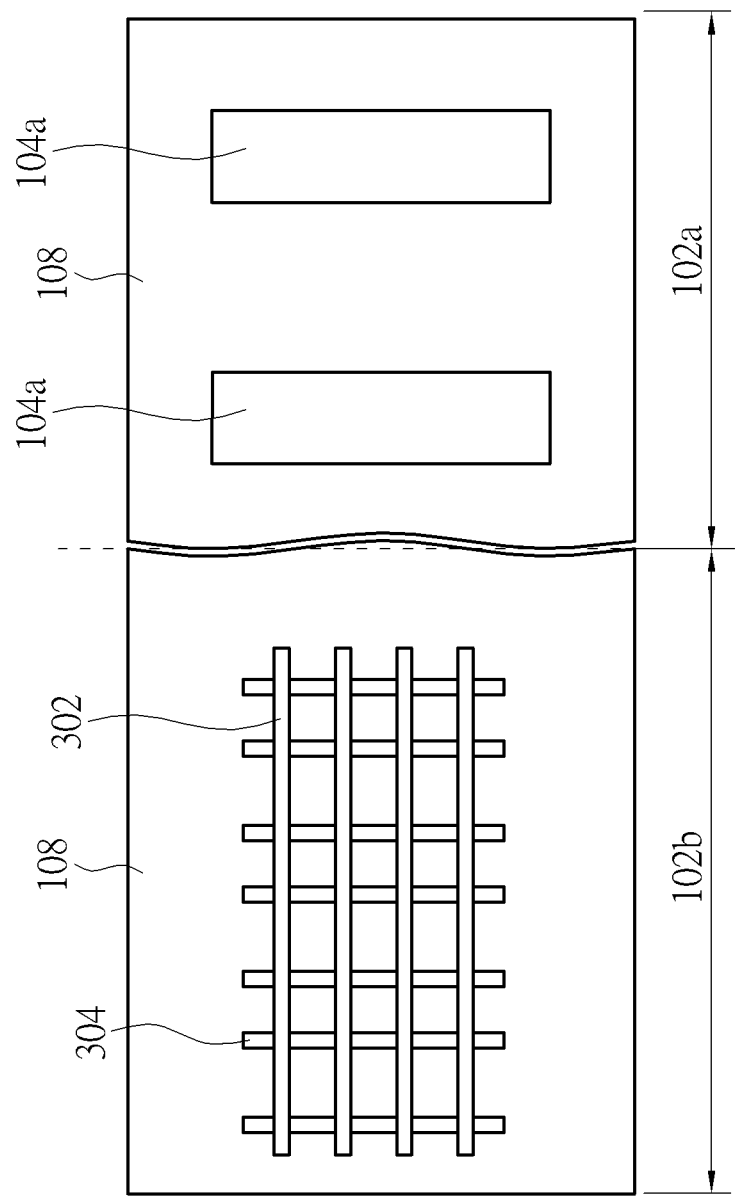
FIG. 13 is a schematic diagram illustrating a method of manufacturing a semiconductor device according to a third preferred embodiment of the present invention.

Refer to FIG. 13, which is a schematic diagram illustrating a method of manufacturing a semiconductor device according to a third preferred embodiment of the present invention. As shown in FIG. 13, as compared with the above-mentioned embodiments, each fin structure may be a gate structure 302. Specifically, in this embodiment, another fin structures 304 that are used to form source and drain are formed on the support substrate 108 before forming the gate structures 302 and the feature structures 104a. After the another fin structures 304 are formed, the gate structures 302 and the feature structures 104a may be formed by using the methods of the above-mentioned embodiments.

As the above mentioned description, the method of manufacturing the semiconductor device in the present invention use the sidewall image transfer (SIT) process with only two photomasks to form not only the fin structures but also the feature structures. Since that, the method of the present invention doesn't require an extra photomask for further defining the feature structures, thereby reducing the manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
   providing a semiconductor substrate and a hard mask layer, wherein the hard mask layer is disposed on the semiconductor substrate, and the semiconductor substrate has a first region and a second region defined thereon;
   using a first photomask to form a sacrificial block on the hard mask layer in the first region, a first dummy pattern on the sacrificial block, a first spacer on sidewalls of the sacrificial block and a second spacer on the hard mask layer in the second region;
   using a second photomask to form a feature mask on the first dummy pattern and a fin cutting mask on the second spacer and the hard mask layer;
   performing a fin cutting process to remove a portion of the first dummy pattern without being covered with the feature mask, a portion of the sacrificial block underlying the portion of the first dummy pattern and the first spacer to form a dummy feature and a sacrificial feature and to remove a portion of the second spacer without being covered with the fin cutting mask to form a plurality of fin spacers;
   transferring the fin spacers and the sacrificial feature to the hard mask layer to form a feature hard mask and a plurality of fin hard masks; and
   transferring the feature hard mask and the fin hard masks to the semiconductor substrate to form a feature structure and a plurality of fin structures.

2. The method of manufacturing the semiconductor device according to claim 1, wherein forming the sacrificial block and the first dummy pattern comprises:
   forming a sacrificial layer on the hard mask layer;
   forming a dummy layer on the sacrificial layer;
   using the first photomask to pattern the dummy layer to form the first dummy pattern in the first region and a second dummy pattern in the second region, wherein a line width of the first dummy pattern is larger than a line width of the second dummy pattern; and
   transferring the first dummy pattern and the second dummy pattern to the sacrificial layer to form the sacrificial block and the sacrificial mandrel respectively, wherein a greater portion of the second dummy pattern is removed as compared to the first dummy pattern.

3. The method of manufacturing the semiconductor device according to claim 2, wherein forming the first spacer and the second spacer comprises:
   conformally forming a spacer layer over the hard mask layer, the first dummy pattern and the second dummy pattern; and
   anisotropically etching the spacer layer to form the first spacer on sidewalls of the sacrificial block and the second spacer on sidewalls of the sacrificial mandrel and to remove the second dummy pattern while maintaining the first dummy pattern.

4. The method of manufacturing the semiconductor device according to claim 3, further comprising removing the sacrificial mandrel between forming the second spacer and forming the fin cutting mask.

5. The method of manufacturing the semiconductor device according to claim 3, wherein performing the fin cutting process further comprises removing a portion of the sacrificial mandrel without being covered with the fin cutting mask.

6. The method of manufacturing the semiconductor device according to claim 5, further comprising removing the remained sacrificial mandrel before forming the fin hard mask.

7. The method of manufacturing the semiconductor device according to claim 1, wherein a line width of the feature mask is larger than a line width of the second spacer.

8. The method of manufacturing the semiconductor device according to claim 7, wherein the line width of the feature mask is two to five times larger than the line width of the second spacer.

9. The method of manufacturing the semiconductor device according to claim 7, wherein the line width of the feature mask is one thousand times larger than the line width of the second spacer.

10. The method of manufacturing the semiconductor device according to claim 9, wherein the feature mask is used to form a trench corresponding to a scribe line for separating two dies.

11. The method of manufacturing the semiconductor device according to claim 1, wherein the fin structure is a gate structure.

* * * * *